(12) United States Patent
Zhu (10) Patent No.: US 6,694,165 B2
(45) Date of Patent: Feb. 17, 2004

(54) METHOD FOR ULTRA-FAST MR FLUOROSCOPY

(75) Inventor: Yudong Zhu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 267 days.

(21) Appl. No.: 09/774,778

(22) Filed: Feb. 1, 2001

(65) Prior Publication Data

US 2002/0010396 A1 Jan. 24, 2002

Related U.S. Application Data

(60) Provisional application No. 60/194,066, filed on Mar. 31, 2000.

(51) Int. Cl.⁷ .................................................. A61B 5/05
(52) U.S. Cl. ........................................................ 600/410
(58) Field of Search .................................. 600/410, 413, 600/415, 407, 419; 128/653; 324/309, 307, 300

(56) References Cited

U.S. PATENT DOCUMENTS

| | | | | |
|---|---|---|---|---|
| 4,830,012 A | | 5/1989 | Riederer | 128/653 |
| 4,837,513 A | * | 6/1989 | Yao | 324/309 |
| 5,243,284 A | | 9/1993 | Noll | 324/309 |
| RE35,656 E | * | 11/1997 | Feinberg et al. | 324/309 |
| 5,810,726 A | | 9/1998 | Van Vaals et al. | 600/410 |
| 5,957,843 A | * | 9/1999 | Luk Pat et al. | 600/410 |
| 5,987,347 A | * | 11/1999 | Khoury et al. | 600/410 |
| 6,198,283 B1 | * | 3/2001 | Foo et al. | 324/309 |
| 6,208,139 B1 | * | 3/2001 | Foo et al. | 324/309 |
| 6,317,619 B1 | * | 11/2001 | Boernert et al. | 600/410 |
| 6,351,122 B1 | * | 2/2002 | Polzin et al. | 324/309 |
| 6,393,313 B1 | * | 5/2002 | Foo | 600/410 |
| 6,430,430 B1 | * | 8/2002 | Gosche | 600/410 |

* cited by examiner

*Primary Examiner*—Daniel Robinson
(74) *Attorney, Agent, or Firm*—Jean K. Testa; Patrick K. Patnode (57) ABSTRACT

A method of data acquisition and reconstruction for use with a Magnetic Resonance Imaging (MRI) system comprises partially traversing k-space in a plurality of segments, computing sub-images for each of the segments, and incrementally reconstructing a plurality of intermediate and final images on-the-fly. The partial k-space traversing reduces data acquisition time and the incremental reconstruction reduces acquisition-to-visualization latency.

7 Claims, 10 Drawing Sheets

METHOD FOR ULTRA-FAST MR FLUOROSCOPY

This application is related to Provisional Application U.S. Serial No. 60/194,066 filed Mar. 31, 2000 in the U.S. Patent and Trademark Office, the contents of which are incorporated herein by reference, and the benefit of priority to which is claimed under 35 U.S.C. 119(e).

BACKGROUND OF THE INVENTION

This invention relates to magnetic resonance imaging (MRI) systems and more particularly to such systems used for acquiring data and reconstructing data for two- or three-dimensional images.

Magnetic Resonance imaging (MRI) involves acquiring data in the spatial frequency domain referred to as k-space, and transforming the data into the spatial domain prior to viewing. The acquired k-space data samples have both magnitude and phase components. The Fourier transform of the k-space data is the MRI image.

Cartesian sampling in k-space followed by inverse discrete Fourier transform (IDFT) represents a commonly-used magnetic resonance imaging scheme. While the IDFT reconstruction is generally realized using the well-known and highly efficient fast Fourier transform (FFT) algorithm, reconstruction latency can still be significant. Reconstruction latency refers to the interval from the time of data acquisition to the time of actual visualization of the corresponding image.

With a modern MR imaging system run in gated time-resolved, interleaved multi-slice or volumetric imaging mode, depending on the data set size the latency may be on the order of tens of seconds, which may seriously hamper the use of the system for real-time or concurrent monitoring and diagnosis. The conventional practice of separating the FFT-reconstruction from the acquisition of a complete set of k-space samples is a main contributor to the latency. Further, the problem is generally aggravated when spatiotemporal coverage/resolution increases, because the time required to complete an FFT increases as the number of data points increases.

With the MR system run in fluoroscopy mode, the reconstruction latency degrades the system's real-time performance and leads to low image frame rate. In this case, computation redundancy may be another major contributor to the latency. To achieve a smoother depiction of imaged dynamics for example, the known technique of sliding-window reconstruction attempts to increase the number of reconstructed images through sharing raw data between reconstructed images. When this technique is applied in Cartesian-sampling based MR fluoroscopy, data acquisition constantly loops through the phase encodes, resulting in a fully refreshed k-space data frame every $T_{traverse}$ seconds ($T_{traverse}$=time required for a complete k-space traversing). Image reconstruction, on the other hand, repeatedly applies FFT to a sliding window of the most recent full set of phase encodes, producing an image every $T_{compute}$ seconds ($T_{compute}$=time required for updating an image). While $T_{traverse}$ determines the temporal resolution of the fluoroscopic images, $T_{compute}$ determines the upper limit of the rate at which one can slide the reconstruction window and hence the frame-rate of the fluoroscopic images. The fluoroscopy's real-time performance will thus be degraded if the FFT's are carried out slowly, because not only will the latency be significant, but also the frame-rate will be low.

In many applications where shortening data acquisition time or enhancing temporal resolution is desired, both reduction of $T_{traverse}$ (to improve temporal resolution) and minimization of $T_{compute}$ (to achieve real-time monitoring capability) are important. Reduction of $T_{traverse}$ can be accomplished through utilizing higher speed gradients for example. Under many circumstances where the MR images are real (up to a constant phase factor), another known technique is to reduce k-space coverage, which generally involves acquiring k-space data with a partial k-space traversing, and consequently reducing the data acquisition time or improving temporal resolution of the fluoroscopic images. However, partial k-space traversing presents some data reconstruction challenges. What is needed is a method for speed-enhanced acquisition and latency-reduced reconstruction when partial k-space traversing is employed.

BRIEF SUMMARY OF THE INVENTION

A method of data acquisition and reconstruction for use with a Magnetic Resonance Imaging (MRI) system comprises partially traversing k-space in a plurality of segments, computing sub-images for each of the segments, and incrementally reconstructing a plurality of intermediate and final images from the sub-images on-the-fly. The partial k-space traversing reduces data acquisition time and the incremental reconstruction reduces acquisition-to-visualization latency.

BRIEF DESCRIPTION OF THE DRAWINGS

The features and advantages of the present invention will become apparent from the following detailed description of the invention when read with the accompanying drawings in which.

DETAILED DESCRIPTION OF INVENTION

Figure 1:
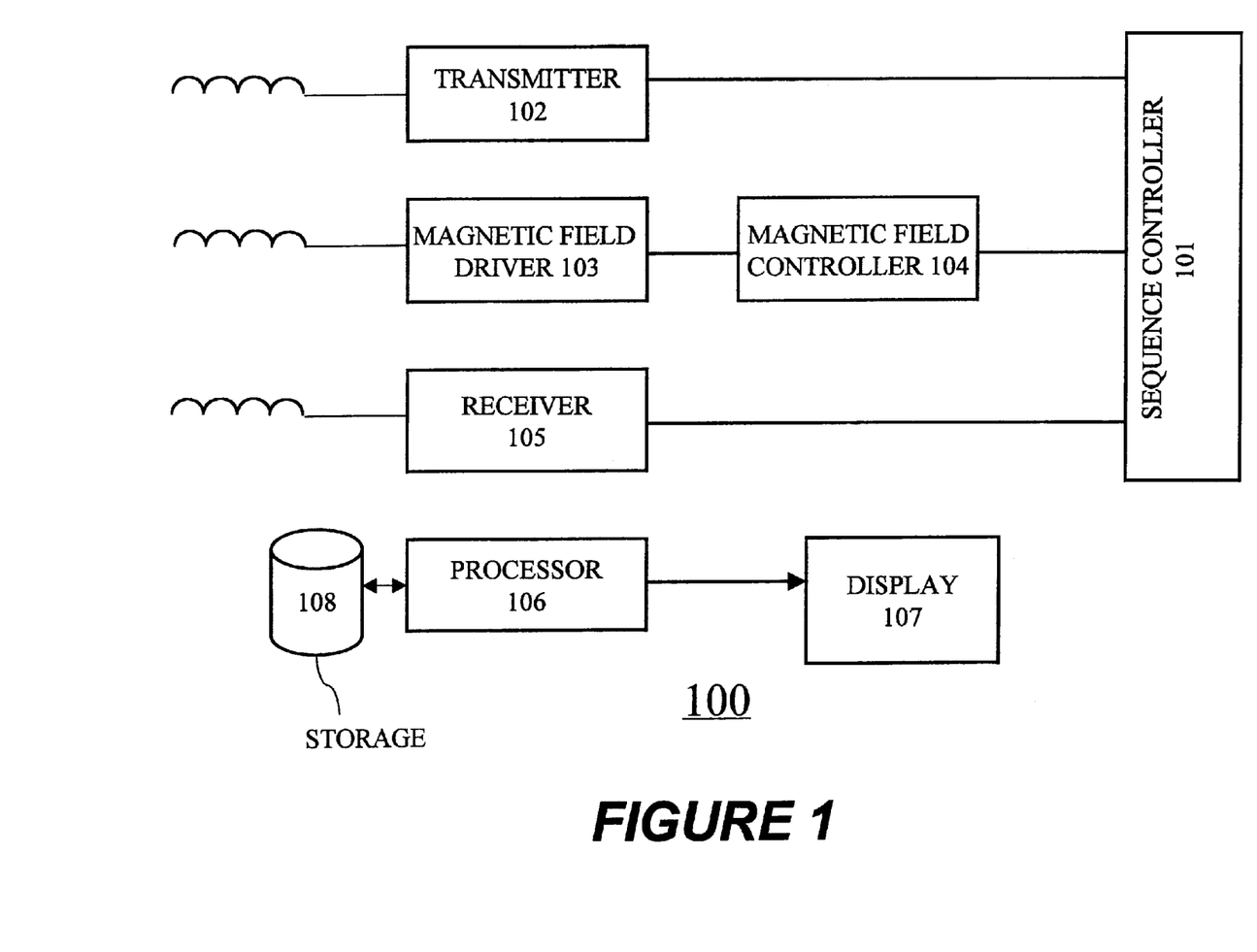
FIG. 1 is a block diagram of a Magnetic Resonance Imaging (MRI) system to which embodiments of the present invention are applicable.

Referring to FIG. 1, there is shown a block diagram of a magnetic resonance imaging (MRI) system for which embodiments of the present invention are applicable. The MRI system 100 comprises a sequence controller 101 for controlling various components of the system, as is well-known, for detecting magnetic resonance signals from the part of an object being imaged; a transmitter 102 for generating an radio frequency (RF) pulse to cause resonance; a magnetic field driver 103 for driving a field gradient in a known manner; a magnetic field controller 104 for controlling the magnetic field; a receiver 105 for receiving and detecting magnetic resonance signals generated from the object; a processor 106 for performing image reconstruction and various calculations for system operation; a display 107 for displaying images; and a peripheral memory device 108 for storing detected signal data and reconstructed images.

As is well-known, within the processor there is memory for storing measured data and reconstructed images. The memory is sufficient to store the whole of N-dimensional measured data as well as reconstructed data. Two-dimensional data (N×M) is stored in memory. The embodiments of the invention will be discussed hereinafter in two-dimensions (2D), however it is appreciated that one skilled in the art can readily generalize equations and embodiments to higher dimensions.

In a well-known manner, an MR image is constructed from the k-space data corresponding to a predetermined plurality of applications of a MRI pulse sequence initiated by a RF pulse such as from transmitter 102 of FIG. 1. The image is updated by collecting k-space data from repetitive MRI pulse seqences. An MR image is reconstructed by performing a series of Fourier transforms along a set of orthogonal directions in k-space.

The known technique of Cartesian k-space sampling and image reconstruction from a sliding window of the most recent full set of phase encodes requires the evaluation of the following FFT:

$$g(m,n) = \lfloor IDFT_{M \times N-point}\{G(k_x,k_y); k_x = 0, 1, \ldots, (M-1),  \quad (1)$$

$$k_y = 0, 1, \ldots, (N-1)\}\rfloor_{evaluated\ at\ (m,n)}$$

$$= \frac{1}{N}\sum_{k_y=0}^{N-1}\left(\frac{1}{M}\sum_{k_x=0}^{M-1}G(k_x,k_y)e^{j\frac{2\pi}{M}k_x m}\right)e^{j\frac{2\pi}{N}k_y n}$$

where G and g denote, respectively, data sampled at a set of k-space grid points and the reconstructed image, and m and n are, respectively, pixel indices in x and y directions. The fast Fourier transform (FFT) is often implemented in the form of cascaded one-dimensional FFT's. For example, N M-point $k_x$-direction FFT's are followed by M N-point $k_y$-direction FFT's. A particularly efficient method calculates each $k_x$-direction FFT immediately after acquiring a set of evenly spaced samples on a $k_y$=constant line. i.e., a view.

Based on the mathematical properties of Equation (1) and with further derivations, Equation (1) is equivalently evaluated as:

$$g(m,n) = \frac{1}{N}\sum_{k_y=0}^{N-1}\left(\frac{1}{M}\sum_{k_x=0}^{M-1}G(k_x,k_y)e^{j\frac{2\pi}{M}k_x m}\right)e^{j\frac{2\pi}{N}k_y n} \quad (2)$$

$$= \sum_{l=0}^{L-1}\left\{\frac{L}{N}\sum_{q=0}^{\frac{N}{L}-1}\left(\frac{1}{M}\sum_{k_x=0}^{M-1}G(k_x,qL+l)e^{j\frac{2\pi}{M}k_x m}\right)e^{j\frac{2\pi}{N/L}qn}\right\}\frac{1}{L}e^{j\frac{2\pi}{N}nl}$$

$$= \tilde{g}_0(m,n)\frac{1}{L}e^{j\frac{2\pi}{N}n 0} + \tilde{g}_1(m,n)\frac{1}{L}e^{j\frac{2\pi}{N}n 1} + \ldots +$$

$$\tilde{g}_{L-1}(m,n)\frac{1}{L}e^{j\frac{2\pi}{N}n(L-1)}$$

where both L and N/L are integers, and for l=0, 1, . . . , L−1, $$\tilde{g}_l(m,n)=$$

$$[L\text{-fold replication}\{IDFT_{M \times N/L\text{-point}}\{G(k_x,qL+l); k_x=0,1,\ldots,$$
$$(M-1), q=0, 1, \ldots, (N/L-1)\}\}]_{evaluated\ at\ (m,n)} \quad (3)$$

The derivation indicates that an M-by-N FFT is equivalently calculated by forming a weighted sum of smaller-sized Fourier transforms (i.e., L M-by-N/L FFT's). Each of these smaller-sized FFT's acts on a down-sampled input data set to generate an aliased version of the M-by-N FFT result, and the weighting and summation effectively unfolds the aliased components and synthesizes an image identical to what would be obtained by applying a full-size FFT reconstruction.

Figure 2:
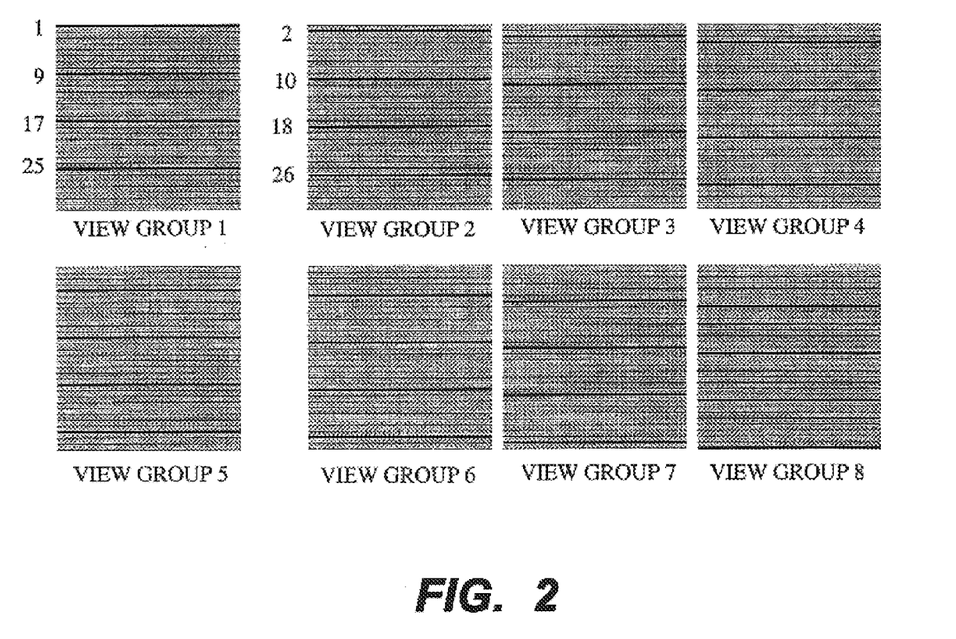
FIG. 2 is an illustration of view groups of k-space data for which embodiments of the present invention are applicable.

In the descriptions of the following embodiments, a view group refers to a set of views, and particularly, a set of views that are evenly spaced along an orthogonal k-space direction, e.g. with constant inter-view spacing (shown in FIG. 2, in which, for example, view group 1 is composed of views 1, 9, 17 and 25, and view group 2 is composed of views 2, 10, 18 and 26, the views being shown as solid lines). A sub-image refers to the result of the FFT of a given view group. A component-image refers to the result of replicating and then weighting a sub-image (in accordance with Equations 2 and 3). An on-the-fly reconstruction refers to the practice of initiating and completing much (not necessarily all) of the reconstruction computations involved in producing an image simultaneously with acquiring the k-space data that contribute to the image.

A latency-minimized method of data acquisition and image reconstruction based on Equation (2) comprises traversing k-space in a sequence of view groups, computing sub-images for each of the view groups immediately after completion of its traversing, and reconstructing a final image on-the-fly by incrementally updating a certain weighted summation of replicated sub-images. Concurrently, the sub-images or the images that are from weighted summations of replicated sub-images are used for monitoring or diagnosis. The incremental updating produces an equivalent final image as a full-size Fourier transform does, but reduces acquisition-to-visualization latency effectively.

In a further efficient method, particularly applicable to MR fluoroscopy, k-space is scanned with a devised scheme and sliding-window reconstruction is performed based on Equation (2). Specifically, a complete traversing of the k-space is segmented into L sequential steps. Each step or segmented traverse acquires a view group that represents an L-fold coarser sampling in the phase encoding direction. For N=32 and L=8, FIG. 2 illustrates an example case where 32 views are segmented into 8 view groups. The imaging pulse sequence repeatedly executes the traversing steps to acquire view groups according to a predetermined order that is selected by an operator of the MRI system, e.g., a sequential order of 1-2-3-4-5-6-7-8-1-2-3-4-5-6-7-8- . . . or an arbitrary order of 1-4-6-3-8-2-7-5-1-4-6-3-8-2-7-5- . . . can be used. It is to be appreciated that the acquisition order used in the following descriptions are for illustration purposes and other order sequences may be used. An M-by-N/L FFT of each view group immediately following its acquisition produces a sub-image that is further replicated and weighted to form a component-image. As data are acquired and intermediate images (i.e., sub-images and component-images) are continuously reconstructed, final fluoroscopic image frames are synthesized incrementally and on-the-fly, involving on the order of MN complex-multiply-and-adds per step. Each fluoroscopic image frame is the result of summing L component-images in the sliding window which is realized by adding new component-image(s) and subtracting obsolete one(s).

Generating intermediate images provides a capability to monitor the patient and/or to steer the reconstruction process for producing higher quality final images. Thus, these intermediate images are useful for monitoring the patient during the scan and/or assist improving the quality of dynamic imaging.

Figure 3:
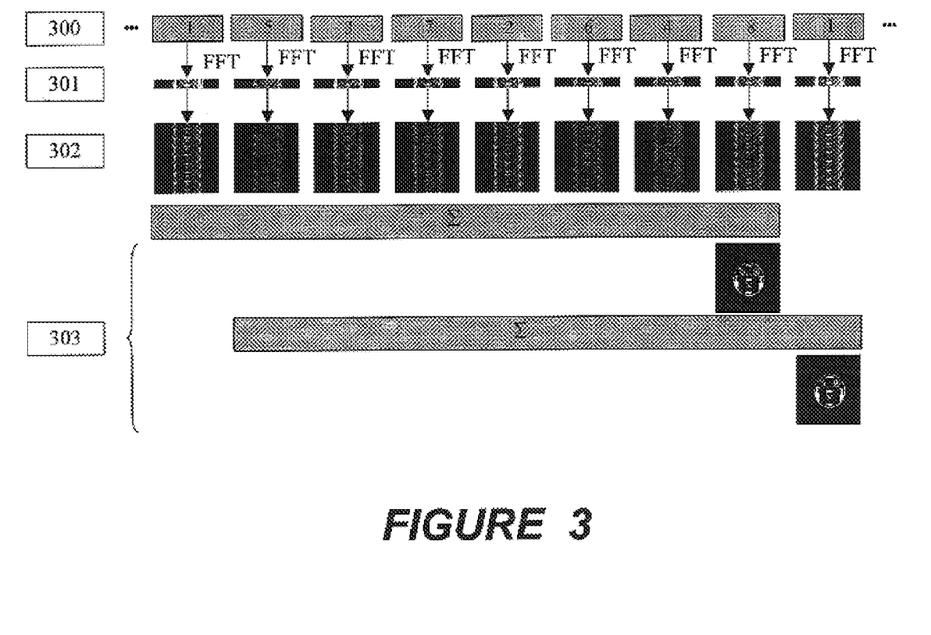
FIG. 3 is an illustration of a method for data acquisition and reconstruction for which embodiments of the present invention are applicable.
Figure 4:
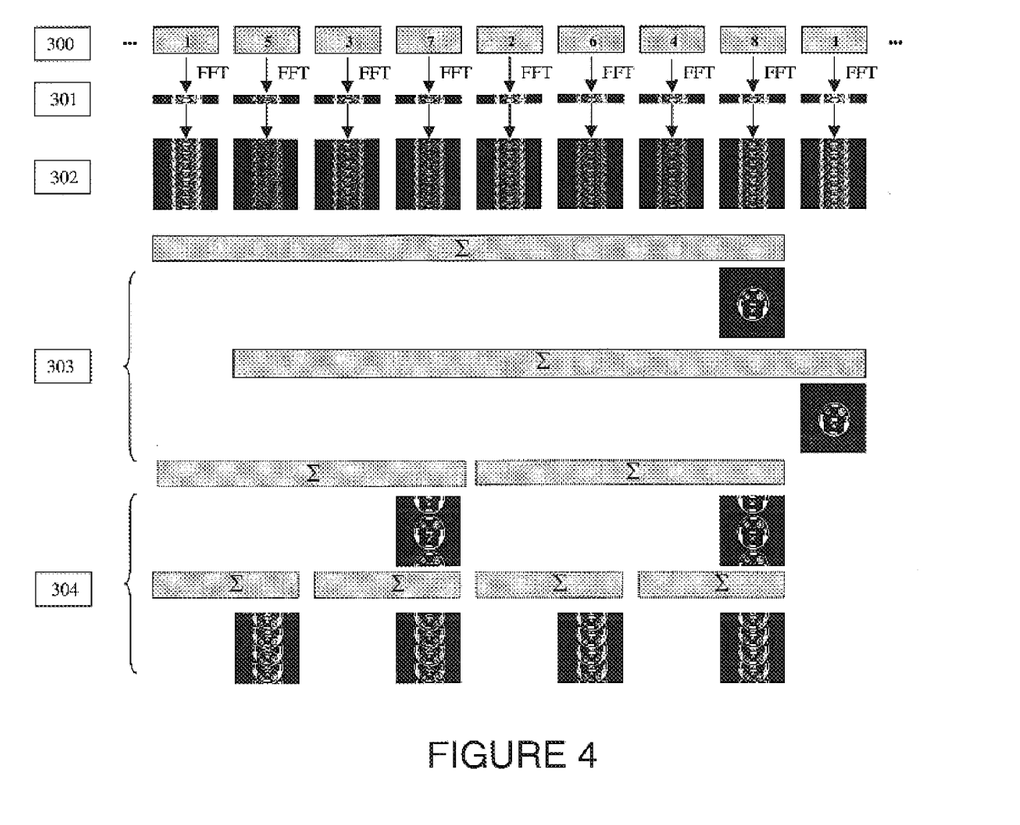
FIG. 4 is an illustration of a method for data acquisition and reconstruction for which embodiments of the present invention are applicable.
Figure 11:
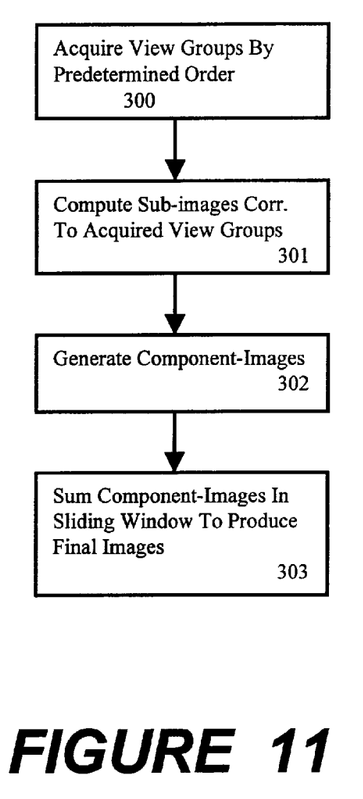
Figure 12:
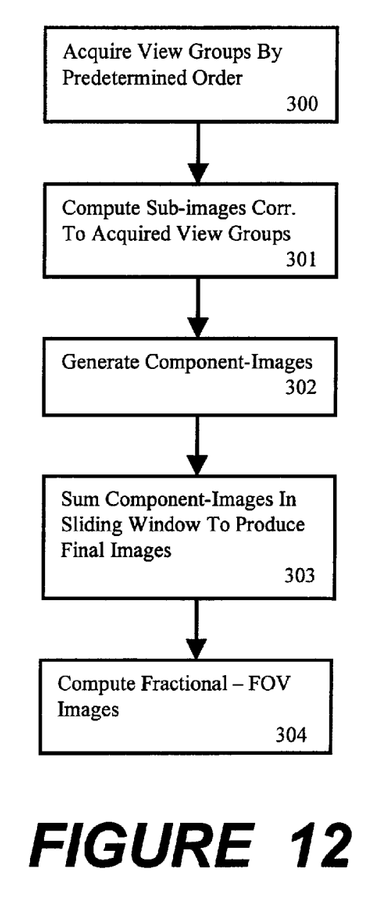

Equation (2) does not impose any constraint on view group acquisition order. FIG. 3 demonstrates the process of incrementally reconstructing fluoroscopic images using sequential ordering. FIG. 4 demonstrates the process of incrementally reconstructing fluoroscopic images using a hierarchical order. View group acquisition in accordance with a hierarchical order effects more frequent update on less dense k-space sampling, and thus facilitates efficient reconstruction of additional fractional field of view (FOV) fluoroscopic images with improved temporal-resolution. Where similar process steps appear in FIGS. 3 and 4, the reference numbers are the same. FIGS. 11 and 12 are the flow diagrams corresponding to FIGS. 3 and 4, respectively.

Referring to FIG. 4, there is shown an illustration where for L=8, the ordering is selected as 1-5-3-7-2-6-4-8-1-5-3-7-2-6-4-8 . . . The derivation for this ordering selection will be further discussed with reference to FIG. 5. Referring further to FIG. 4, 8-fold coarser sampling is refreshed 8 times as frequently as the full sampling, 4-fold, 4 times, and so on.

Referring to FIGS. 3, 4, 11 and 12, at step 300, view group acquisition is performed in accordance with a predetermined order, for example sequentially as discussed above and shown in FIG. 3 or hierarchically as 1-5-3-7-2-6-4-8-1-5-3-7-2-6-4-8 . . . as shown in FIG. 4. The imaging sequence continuously acquires view groups according to the predetermined order. M-by-N/L FFT of each view group, at step 301, yields a sub-image for the group. At step 302, the sub-image is further replicated and weighted to form a component-image. At step 303, an updated image is reconstructed by summing L component-images in the sliding window. Image update is realized by adding new component-image(s) and subtracting obsolete one(s). Referring further to FIGS. 3 and 4, a representative set of sub-images, component-images and final images are shown adjacent to each of the steps.

Referring to FIGS. 4 and 12, if the acquisition of view groups is in accordance with a hierarchical order, further processing desirably occurs. At step 304, an optional computation computes the sum of every p (an integer that satisfies $p=2^r, 1 \leq r \leq \log L$) component-images to generate fractional field-of-view (FOV) intermediate images that are of p-fold higher temporal resolution (but p-fold smaller y-direction field-of-view (FOV)). Referring further to FIG. 4, a representative set of intermediate higher temporal-resolution images are shown adjacent to the optional step 304.

When implementing the above methods, depending on the sequence timing and processor speed, L is selected such that $T_{compute}$ (total time needed to compute an M×N/L FFT, replicate and weight the result, and update a summation) is less or equal to $T_{traverse}/L$ (total time needed to acquire a view group). Employing the above-described methods leads to an effective reconstruction latency of $T_{compute}$ and a frame rate of $\sim 1/T_{compute}$, representing a factor of $\sim \alpha L$ ($\alpha=(1+(L-\log L/\log MN)^{-1})$ improvement over existing sliding-window techniques that must at least re-compute N full-size $k_y$-direction FFT's for every image frame update. Due to an increased number of complex-multiply-and-adds resulting from partitioning a full FFT, for a given processor speed there may be a maximum L satisfying the $T_{compute} \leq T_{traverse}/L$ constraint. With the support of multiple processors or DSP chips that run in parallel, further latency reduction is achievable.

The order with which the imaging sequence acquires the views in a view group is not constrained by the present technique and may be independently optimized based on MR physics considerations. When implementing with a multi-shot, interleaved, echo planar imaging pulse sequence for example, it may be desirable to choose to employ a few shorts, each traversing a center-out trajectory, to fill each view group.

For every image to be reconstructed, the intermediate images reconstructed from the steps of coarse sampling each represents an aliased version of the image. Generating intermediate results provides a capability to produce intermediate images suitable to monitor the patient and/or to steer the reconstruction process for producing higher quality final images. Thus, these intermediate images are useful for monitoring the patient during the scan and/or assist improving the quality of dynamic imaging. Use of the hierarchical order allows highly efficient construction of intermediate images (of fractional-FOV). In a cardiac imaging application for example, these intermediate images have relatively higher temporal resolution and thus tend to depict dynamics of interest with less temporal blurring. Further, as a way of minimizing degrading effects from motion that is not cardiac-synchronized (e.g., respiratory motion), these images may be cross-correlated with a reference kernel to determine the intervening motion and results be used to steer imaging by discarding-then-reacquiring non-cohesive component-images.

Figure 5:
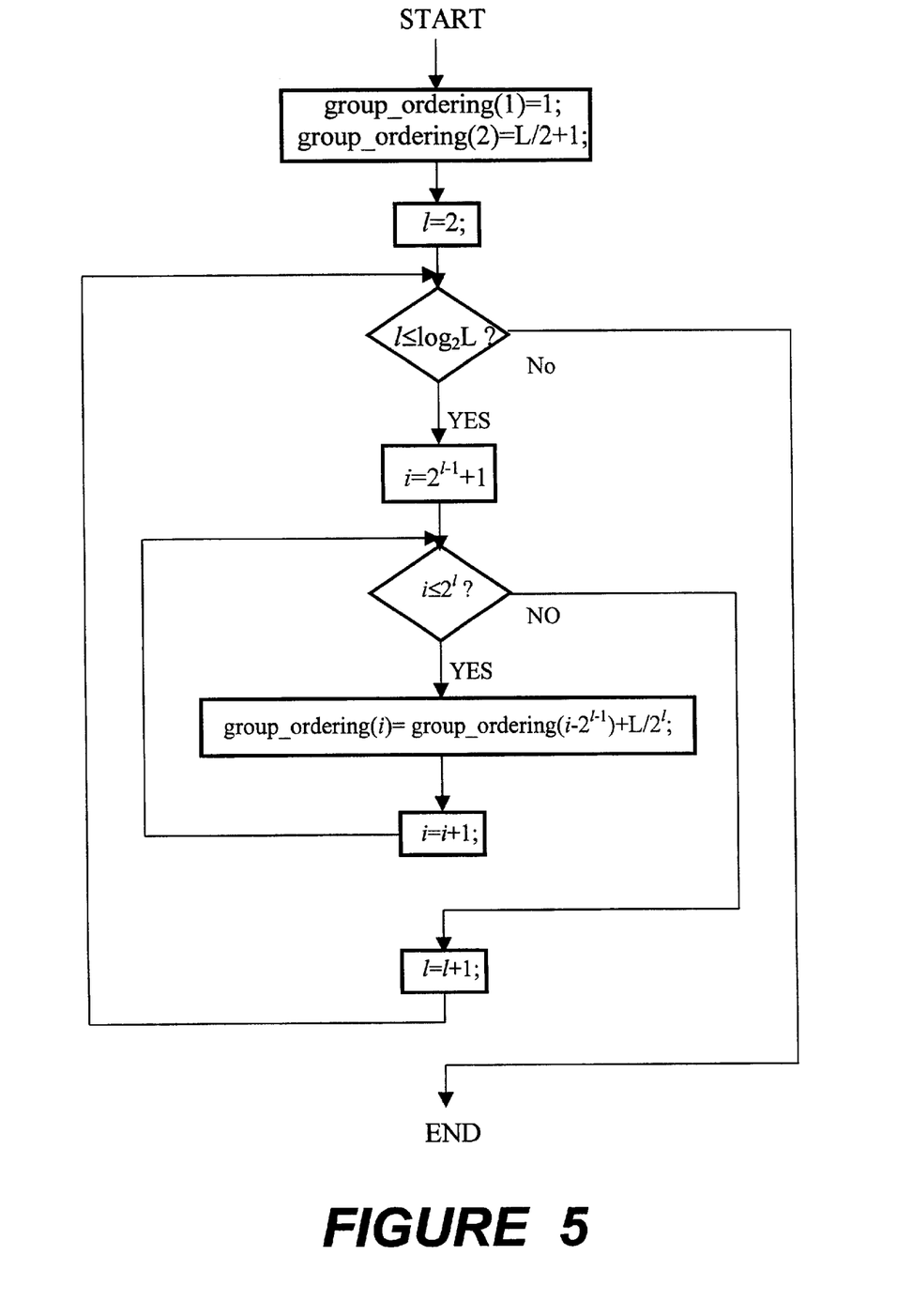
FIG. 5 is a flow diagram of a view group acquisition scheme for which embodiments of the present invention are applicable.

Referring to FIG. 5, there is shown a block diagram illustrating an algorithm for deriving a hierarchical view group acquisition ordering discussed with reference to FIG. 4. As the imaging sequence is required to acquire L view groups in a cyclic fashion, the relative ordering within a cycle is derived according to the algorithm, however with which group the imaging sequence starts is of no significance. The illustration therefore simply assumes the first acquired group is view group 1. Processed according to the flow of FIG. 4, the array "group_ordering" stores the view group ordering upon completion (e.g., it stores 1-5-3-7-2-6-4-8 when L=8).

Compared to existing MR fluoroscopy techniques (with Cartesian k-space sampling and sliding-window image reconstruction) that compute full-size $k_y$- and/or $k_z$-direction Fourier transformation for every image update, the methods discussed above synthesize a new image by summing smaller-sized Fourier transformation results. The smaller-sized transformation results are faster to evaluate and shared between image updates. Sharing smaller-sized transformation results eliminates costly redundant computation and distributing transformation calculation into data acquisition periods further reduces reconstruction latency. It can be appreciated that implementation may be extended to 3D, for example in interleaved multi-slice imaging, or volumetric imaging (3D spatial encoding) with similar advantages.

Discussed thus far are data acquisition and reconstruction methods in which full k-space traversing is employed and full sets of phase encodes are acquired by the MR system. For high quality fluoroscopy, it is advantageous to reduce the time to traverse k-space ($T_{traverse}$) thus improving temporal resolution of the resulting images. Such reduction is possible by partially traversing k-space. In embodiments of the present invention, the methods discussed with reference to a full k-space traversing are adapted to accommodate partial or fractional k-space acquisition when less than 100 percent of all phase encodes is acquired.

An embodiment of a method of speed-enhanced acquisition and latency-reduced reconstruction comprises the steps of acquiring a selected plurality of k-space data segments by partial k-space traversing and deriving a plurality of skipped views of k-space data. In this embodiment, the selected plurality of segments are pairs of fractional view groups (i.e. fractional being less than 100% of the views within a given view group) and the deriving step fills in skipped views in the fractional view groups in accordance with Hermitian symmetry. The method further comprises evaluating a Fourier transform for each of the plurality of the filled-in view groups and reconstructing an image with the respective ones of the evaluated Fourier transforms. In summary, the method comprises traversing partial k-space in a plurality of fractional view groups, filling-in skipped views and computing a pair of sub-images for each of a plurality of view group pairs immediately after completion of the pair's acquisition, and incrementally reconstructing final images on-the-fly in a way that is equivalent to computing full-sized FFT's on full k-space data sets.

A technique for reducing k-space traversing time through partial k-space traversing is referred to herein as fractional-NEX (number of excitations) acquisition. When the MR image is real (or real×exp(j2πφ$_0$), where the constant phase term can be removed with a conventional pre-processing step), the fractional-NEX acquisition is desirably employed. A known property of k-space data in this case is that of Hermitian symmetry. In accordance with Hermitian symmetry, the k-space data of view group l is the complex conjugate of the flipped k-space data of view group L+1−l. A method employing Hermitian symmetry assembles complete view groups from fractional-NEX view group acquisitions, which, for half-NEX (half of k-space) acquisitions for example, is formally expressed as:

$$\text{view group } l = \begin{bmatrix} \text{top half of view group } l \\ \text{conjugate(flip\_left\_right(flip\_up\_down(top half of view group } L+1-l))) \end{bmatrix} \quad (4)$$

$$\text{view group } L+1-l = \begin{bmatrix} \text{top half of view group } L+1-l \\ \text{conjugate(flip\_left\_right(flip\_up\_down(top half of view group } l))) \end{bmatrix}$$

Figure 6:
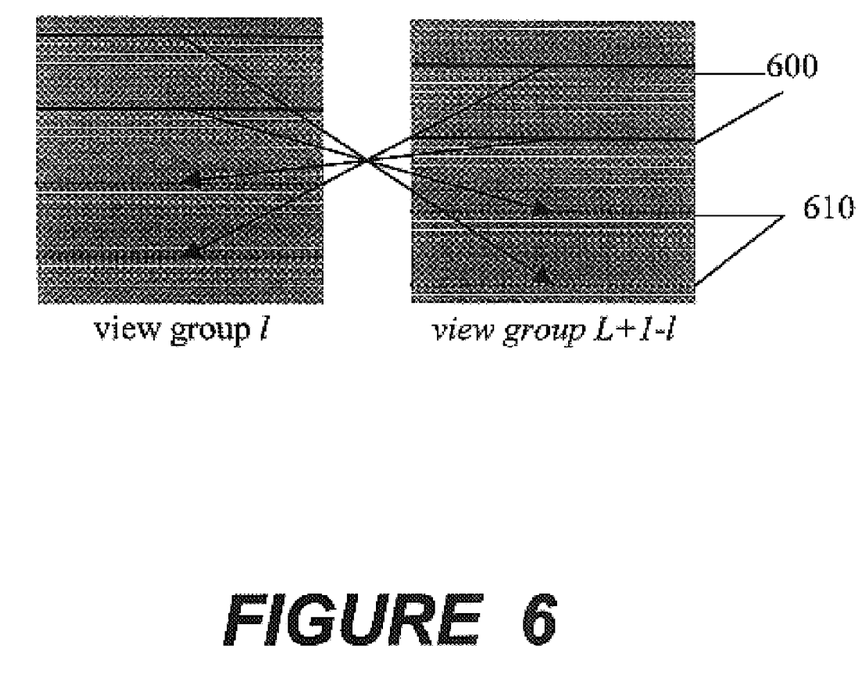
FIG. 6 is an illustration of view groups of k-space data for which embodiments of the present invention are applicable.

The application of Equation (4) is illustrated in FIG. 6 using the example case of N=32 and L=8. Generally, if it is desirable to acquire more than half-NEX (e.g., ¾-NEX), a way of handling each pair of overlapped views is to use their average (in accordance with Hermitian symmetry). FIG. 6 illustrates the assembling of complete view groups using fractional-NEX view group acquisitions. The solid lines 600 indicate acquired views and the dotted lines 610 indicate views derived and filled in based on Hermitian symmetry. The arrows in FIG. 6 indicate the operation of the filling in of the skipped views of the view group pair.

Figure 7:
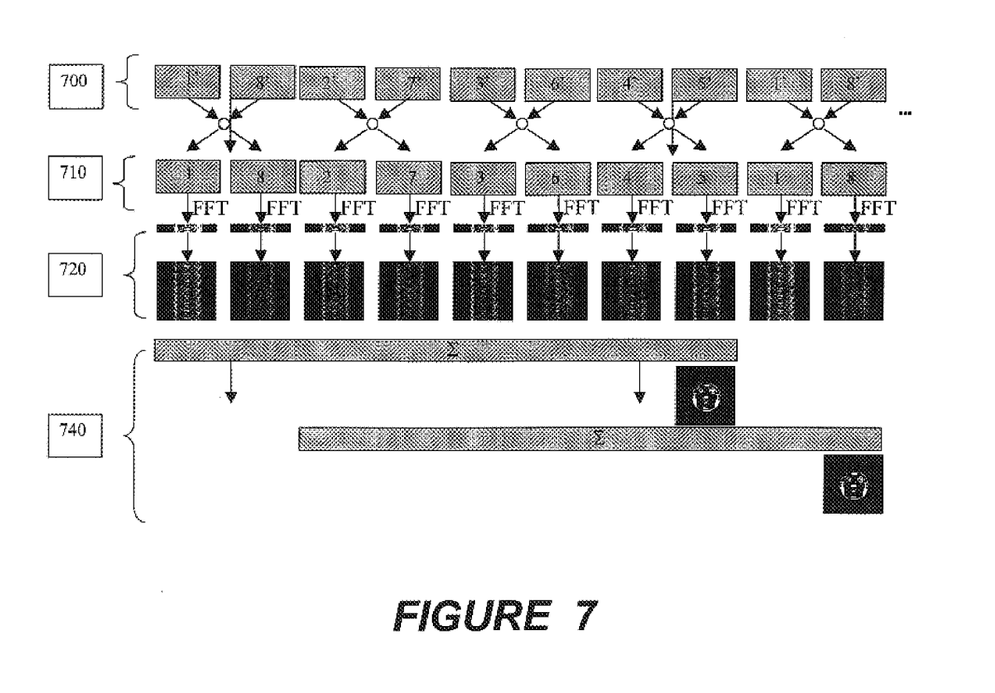
FIG. 7 is an illustration of an embodiment of the present invention.
Figure 9:
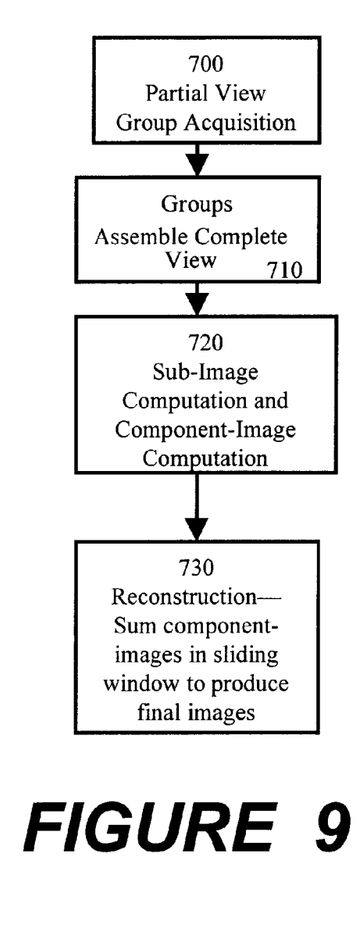
FIGS. 9 and 10 are flow diagrams corresponding to the illustrations of FIGS. 7 and 8, respectfully; and, FIGS. 11 and 12 are flow diagrams corresponding to the illustrations of FIGS. 3 and 4, respectfully.
Figure 10:
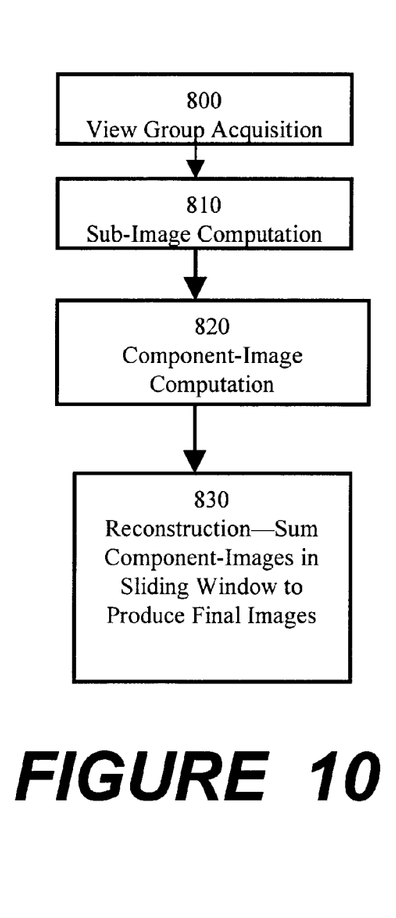

Referring to FIGS. 7 and 9, there is shown an illustration and flow diagram of an embodiment of the present invention. At step 700 that partial view groups are acquired in pairs according to Equation (4), for example a pair of partial view groups 1' and 8', as shown in FIG. 7. At step 710, with Hermitian sysmmetry properties discussed above, complete view groups are assembled in which views that were skipped during partial k-space traversing are derived and filled in as shown in and discussed with reference to FIG. 6. Using the assembled view groups, step 720 computes sub-images and component-images, and step 730 reconstructs the component-images into a final image in a similar manner as described with reference to FIGS. 3 and 4. The method shown in FIG. 7 differs from the full-NEX (FIGS. 3 and 4) version in that view group pairs with Hermitian symmetry are grouped together and the assembling operation described above is used to fill in views that are skipped in the fractional-NEX view group acquisitions.

In fractional-NEX MR fluoroscopic imaging applications, a preliminary computer simulation (L=32) indicated 30% and 44% reductions in reconstruction time of an image frame of size 128×128 and 256×256 respectively. With the enhanced temporal resolution due to the use of fractional-NEX acquisitions and the improved reconstruction efficiency due to the FFT methods discussed with reference to FIGS. 3 and 4, the proposed scheme represents a promising technique for doing ultra-fast MR fluoroscopy.

In another embodiment, an even more efficient method of speed-enhanced acquisition and latency-reduced reconstruction comprises the steps of acquiring a selected plurality of k-space data segments by partial k-space traversing, computing a pair of sub-images for each of the segments immediately after completion of acquiring the respective segment, and incrementally reconstructing final images on-the-fly, as discussed with reference to FIGS. 3 and 4. In this embodiment, the data segments each comprises a view group. This embodiment differs from the previous one in that a separate step of explicitly assembling the skipped views is not employed, rather, sub-images of the acquired view groups are used to efficiently derive the sub-images of skipped view groups. Let $h(n_x,n_y)$ and $h^s(n_x,n_y)$ denote the DFT's of $H(k_x,k_y)$ and $H^s(k_x,k_y)$ respectively. If $H^s(k_x,k_y)$ is in Hermitian symmetry with $H(k_x,k_y)$, i.e., $$H^s(k_x,k_y)=H_{real}(N_x-k_x-1,N_y-k_y-1)-jH_{imag}(N_x-k_x-1,N_y-k_y-1),$$
$$0 \leq k_x \leq N_x-1, \; 0 \leq k_y \leq N_y-1 \quad (5)$$

then $h^s(n_x,n_y)$ is related to $h(n_x,n_y)$ by:

$$h^s(n_x,n_y) = \frac{1}{N_y}\sum_{k_y=0}^{N_y-1}\left(\frac{1}{N_x}\sum_{k_x=0}^{N_x-1} H^s(k_x,k_y)e^{j2\pi\frac{n_x}{N_x}k_x}\right)e^{j2\pi\frac{n_y}{N_y}k_y} \quad (6)$$

$$= \frac{1}{N_y}\sum_{k_y=0}^{N_y-1}\left(\frac{1}{N_x}\sum_{k_x=0}^{N_x-1}(H_{real}(k_x,k_y)-jH_{imag}(k_x,k_y))e^{-j2\pi\frac{n_x}{N_x}k_x}e^{-j2\pi\frac{n_y}{N_y}k_y}\right)e^{-j2\pi\frac{n_x}{N_x}}e^{-j2\pi\frac{n_y}{N_y}}$$

$$= e^{-j2\pi\frac{n_x}{N_x}}e^{-j2\pi\frac{n_y}{N_y}}(h_{real}(n_x,n_y)-jh_{imag}(n_x,n_y))$$

Figure 8:
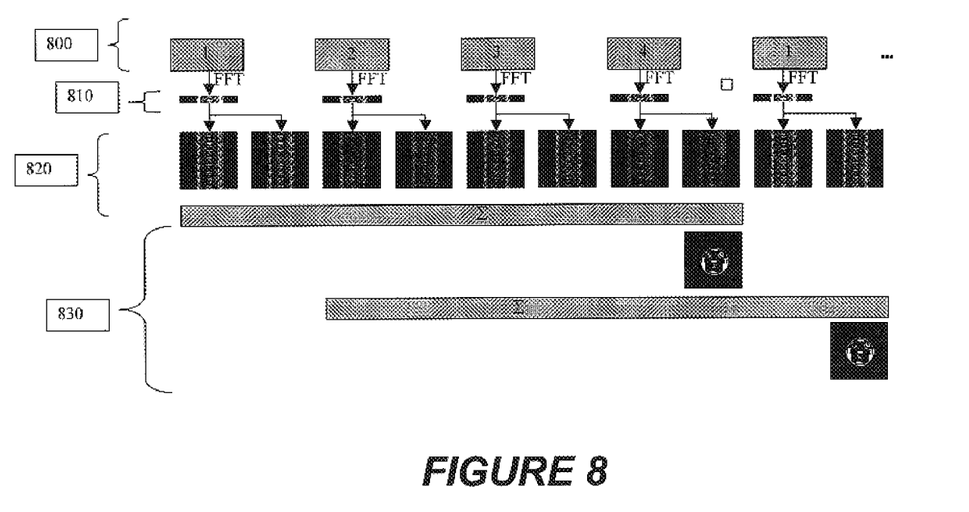
FIG. 8 is an illustration of an embodiment of the present invention.

In cases where the images are real, view group l and view group L+1−l are in Hermitian symmetry, then FFT of view group L+1−l are derived from the FFT of view group l based on Equation 6. For half-NEX fluoroscopic imaging, this implies data acquisition repeatedly acquires half of the view groups. For an example case where L=8, FIG. 8 illustrates a fluoroscopic imaging scheme based on a simple order: 1-2-3-4-1-2-3-4- . . . As the imaging sequence continuously acquires view groups at step 810 according to the acquisition order, M×N/L FT of each group yields a sub-image at step 810 that is further processed to form a pair of component-images as shown at step 820. At step 830, each reconstructed image frame is the result of summing L component-images in the sliding window, and frame update is realized by adding new component-images and subtracting obsolete ones. Note that the present technique does not require filling in (i.e., assembling) views that are skipped in the fractional-NEX acquisition, and also that the technique involves half as many FFT's.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method of data acquisition and reconstruction for use with a Magnetic Resonance Imaging (MRI) system comprising:

acquiring a selected plurality of k-space data segments by partial k-space traversing, said data segments comprising groups of views of k-space, said views being sets of k-space data samples along a selected k-space direction and said groups being a plurality of views along an orthogonal k-space direction;

computing a pair of sub-images for each of said data segments after acquiring the respective data segments; and, reconstructing a plurality of images from said sub-images substantially incrementally and concurrently with acquisition of said k-space data.

2. The method of claim 1 wherein said partial k-space traversing is half k-space traversing.

3. The method of claim 1 wherein each of said k-space data segments is a pair of fractional view groups; and, said step of computing said pair of sub-images comprises the steps of deriving a plurality of respective skipped views to create a pair of filled-in view groups and evaluating a Fourier transform for each of said filled-in view groups.

4. The method of claim 3 wherein a view comprises a set of evenly spaced samples of k-space data along a selected k-space direction, a view group comprises a plurality of said views that are evenly spaced along an orthogonal k-space direction, and each of said fractional view groups comprises less than 100% of views of a view group.

5. The method of claim 3 wherein said deriving step comprises computing said skipped views in accordance with Hermitian symmetry.

6. The method of claim 1 wherein said reconstruction step further comprises the steps of:

computing a respective component-image from each of said sub-images, incrementally summing said respective component-images to form said plurality of images.

7. The method of claim 1 wherein each of said k-space data segments is a view group; and, said step of computing said pair of sub-images comprises the steps of evaluating a Fourier transform for the view group and deriving a Fourier transform for a respective view group that is skipped in said acquiring step.

* * * * *